(12) United States Patent
Baumgartner et al.

(10) Patent No.: US 7,552,407 B2
(45) Date of Patent: *Jun. 23, 2009

(54) METHOD AND SYSTEM FOR PERFORMING TARGET ENLARGEMENT IN THE PRESENCE OF CONSTRAINTS

(75) Inventors: Jason R. Baumgartner, Austin, TX (US); Robert L. Kanzelman, Rochester, MN (US); Hari Mony, Austin, TX (US); Viresh Paruthi, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/036,093

(22) Filed: Feb. 22, 2008

(65) Prior Publication Data

US 2008/0216029 A1 Sep. 4, 2008

Related U.S. Application Data

(63) Continuation of application No. 11/225,672, filed on Sep. 13, 2005, now Pat. No. 7,373,624.

(51) Int. Cl.
*G06F 17/50* (2006.01)
*G06F 9/45* (2006.01)
*G06F 7/60* (2006.01)

(52) U.S. Cl. .................................. 716/4; 716/5; 703/2

(58) Field of Classification Search ............... 716/1–18
See application file for complete search history.

(56) References Cited

U.S. PATENT DOCUMENTS 6,134,516 A * 10/2000 Wang et al. .................. 703/27

OTHER PUBLICATIONS

Bischoff et al., "Exploiting Target Enlargement and Dynamic Abstraction within Mixed BDD and SAT Invariant Checking", Second International Workshop on Bounded Model Checking (Jul. 2004).*

* cited by examiner

*Primary Examiner*—Vuthe Siek
*Assistant Examiner*—Aric Lin
(74) *Attorney, Agent, or Firm*—Dillon & Yudell LLP

(57) ABSTRACT

A method for performing verification is disclosed. The method includes receiving a design, including one or one or more targets, one or more constraints, one or more registers and one or more inputs. A first function of one of the one or more targets over the one or more registers and the one or more inputs is computed. A second function of one or more of the one or more constraints over the one or more registers and the one or more inputs is computed. The inputs of the first function and the second function are existentially quantified. A bounded analysis is performed to determine if the one of the one or more targets may be hit while adhering to the constraints. A preimage of the inputs of the first function and a preimage of the inputs of the second function is existentially quantified to create a synthesizable preimage. The synthesizable preimage is simplified and synthesized to create an enlarged target. Verification of the enlarged target is performed.

13 Claims, 11 Drawing Sheets

METHOD AND SYSTEM FOR PERFORMING TARGET ENLARGEMENT IN THE PRESENCE OF CONSTRAINTS

CROSS-REFERENCE TO RELATED APPLICATION

The present application is a continuation of U.S. patent application Ser. No. 11/225,672, filed on Sep. 13, 2005 now U.S. Pat. No. 7,373,624, and entitled "Method and System for Performing Target Enlargement in the Presence of Constraints" which is assigned to the assignee of the present invention and incorporated herein by reference in its entirety.

BACKGROUND OF THE INVENTION

1. Field of the Invention

The present invention relates in general to verifying designs and in particular to verifying a logic function in a netlist. Still more particularly, the present invention relates to a system, method and computer program product for performing target enlargement in the presence of constraints.

2. Description of the Related Art

With the increasing penetration of microprocessor-based systems into every facet of human activity, demands have increased on the microprocessor development and production community to produce systems that are free from data corruption. Microprocessors have become involved in the performance of a vast array of critical functions, and the involvement of microprocessors in the important tasks of daily life has heightened the expectation of reliability of calculative results. Whether the impact of errors would be measured in human lives or in mere dollars and cents, consumers of microprocessors have lost tolerance for error-prone results. Consumers will not tolerate, by way of example, miscalculations on the floor of the stock exchange, in the medical devices that support human life, or in the computers that control their automobiles. All of these activities represent areas where the need for reliable microprocessor results has risen to a mission-critical concern.

Formal verification techniques, semiformal verification techniques and simulation provide powerful tools for discovering errors in verifying the correctness of logic designs. Formal verification techniques, semiformal verification techniques and simulation frequently expose probabilistically uncommon scenarios that may result in a functional design failure. Additionally, formal verification techniques provide the opportunity to prove that a design is correct (i.e., that no failing scenario exists)

One commonly-used approach to formal, semiformal, and simulation analysis for applications operating on representations of circuit structures is to represent the underlying logical problem structurally (as a circuit graph), and to perform explicit or symbolic evaluation of that circuit graph.

In such an approach, a logical problem is represented structurally. Constraints are often used in verification to prune the possible input stimulus in certain states of the design. For example, a constraint may state "if the design's buffer is full, then constrain the input stimulus to prevent new transfers into the design". Semantically, the verification tool will typically discard any states for which a constraint evaluates to a 0 (i.e., the verification tool may never produce a failing scenario showing a violation of some property of the design, if that scenario does not adhere to all the constraints for all time-steps prior to the failure). In this previous example, it would be illegal for the verification tool to produce a trace of length "i" showing a violation of some property, if that trace illustrated the scenario that the buffer was full and a new transfer was initiated into the design between time 0 and i (inclusive).

Explicit simulation-based approaches to hardware verification are scalable to very large designs, though suffer from the coverage problem that generally limits them to yielding exponentially decreasing coverage with respect to design size. Formal verification techniques overcome the coverage problem of simulation, yielding exhaustive coverage, though suffer from computational complexity that limits their application to smaller designs.

Target enlargement is a technique that has been proposed to partially leverage formal algorithms to enhance the coverage attainable with simulation. The idea of target enlargement is to use formal algorithms to enumerate the set of design states which may falsify a given property within "i" time-steps, then to use simulation to try to hit this enlarged state set instead of directly attempting to falsify the property. One primary benefit of target enlargement is that simulation need only come within "i" time-steps of falsifying the property to expose a failure, whereas without target enlargement simulation must directly falsify the property which may be exponentially less probable. For example, it could be that only one of the possible $2^N$ (where ^ denotes exponentiation) input vectors for a design with N inputs traverses the design closer to the failure, thus to obtain the proper "i"-step extension of a simulation run to hit the original target, it may require a specific one of $(2^N)^i = 2^{(i*N)}$ possible sequences of input vectors to hit the original target from the state that hits the enlarged target. This example illustrates how target enlargement effectively leverages formal algorithms to exponentially increase the coverage of simulation approaches.

Verification constraints are increasingly-pervasive constructs in the modeling of verification environments. A verification constraint is a specially-labeled gate of a design, where the semantics of the constraint are such that the verification toolset cannot produce a "j" time-step trace showing a violation of a property which evaluates any of the constraints to a 0 within those "j" time-steps. Constraints thus alter the verification task from: compute a "j"-step trace showing a violation of a property or prove that no such trace exists for any "j", to: compute a "j"-step trace showing a violation of a property which never evaluates any constraint gate to 0 within that time-frame or prove that no such trace exists for any "j".

Under the prior art, no solution exists for performing target enlargement in the presence of verification constraints. Traditional target enlargement approaches are not applicable to designs with verification constraints.

SUMMARY OF THE INVENTION

A method for performing verification is disclosed. The method includes receiving a design, including one or one or more targets, one or more constraints, one or more registers and one or more inputs. A first function of one of the one or more targets over the one or more registers and the one or more inputs is computed. A second function of one or more of the one or more constraints over the one or more registers and the one or more inputs is computed. The inputs of the first function and the second function are existentially quantified. A bounded analysis is performed to determine if the one of the one or more targets may be hit while adhering to the constraints. A preimage of the inputs of the first function and a preimage of the inputs of the second function is existentially quantified to create a synthesizable preimage. The synthesizable preimage is simplified and synthesized to create an enlarged target. Verification of the enlarged target is performed.

BRIEF DESCRIPTION OF THE DRAWINGS

The present invention is described in a preferred embodiment in the following description with reference to the drawings, in which like numbers represent the same or similar elements, as follows.

DETAILED DESCRIPTION OF A PREFERRED EMBODIMENT

The present invention provides a system, method and computer program product for performing target enlargement in the presence of constraints when verifying a design. The present invention allows the use of target enlargement as a property-preserving transformation of a design, and helps ensure that if an enlarged target is hittable, the original target will also be hittable. Additionally, the present invention helps ensure that if the enlarged target is proven unreachable, the original target will also be unreachable. Finally, in the case that the enlarged target is hit, the present invention provides a method to map that hit to a legal hit of the original target.

No prior work has addressed the challenges of the application of target enlargement in the presence of verification constraints. The present invention thus enables the benefits of target enlargement to enhance the process of exposing design failures (falsification), as well as demonstrating that no design failure exists (verification) for designs with constraints.

Figure 1:
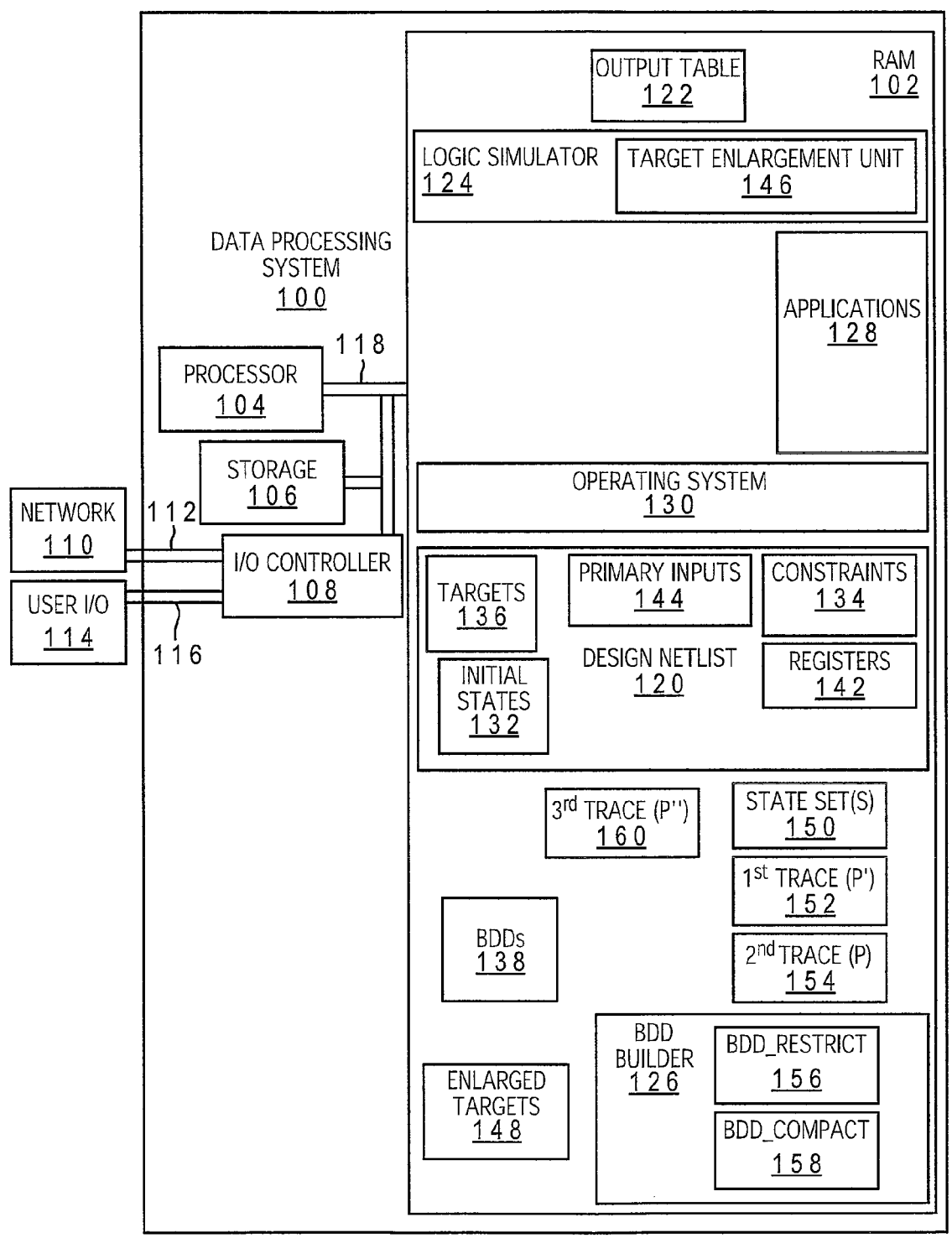
FIG. 1 illustrates a block diagram of a general-purpose data processing system with which the present invention of a system, method and computer program product for target enlargement in the presence of constraints may be performed.

With reference now to the figures, and in particular with reference to FIG. 1, a block diagram of a general-purpose data processing system, in accordance with a preferred embodiment of the present invention is depicted. Data processing system 100 contains a processing storage unit (e.g., RAM 102) and a processor 104. Data processing system 100 also includes non-volatile storage 106 such as a hard disk drive or other direct-access storage device. An Input/Output (I/O) controller 108 provides connectivity to a network 110 through a wired or wireless link, such as a network cable 112. I/O controller 108 also connects to user I/O devices 114 such as a keyboard, a display device, a mouse, or a printer through wired or wireless link 116, such as cables or a radio-frequency connection. System interconnect 118 connects processor 104, RAM 102, storage 106, and I/O controller 108.

Within RAM 102, data processing system 100 stores several items of data and instructions while operating in accordance with a preferred embodiment of the present invention. These include a design netlist 120 and an output table 122 for interaction with a verification toolset 124 and a binary decision diagram builder 126. Other applications 128 and verification toolset 124 interface with processor 104, RAM 102, I/O control 108, and storage 106 through operating system 130. One skilled in the data processing arts will quickly realize that additional components of data processing system 100 may be added to or substituted for those shown without departing from the scope of the present invention. Other data structures within RAM 102 include state set (S) 150, $1^{st}$ trace (p') 152, $2^{nd}$ trace (p) 154, $3^{rd}$ trace (p") 160 and binary decision diagrams 138. BDD builder 126 contains BDD-related functions, such as BDD_Compact 158 and BDD_Restrict 156.

A netlist graph, such as design netlist 120, is a popular means of compactly representing problems derived from circuit structures in computer-aided design of digital circuits. Such a representation is non-canonical and offers some ability to analyze the function from the nodes in the graph. A netlist contains a directed graph with vertices representing gates and edges representing interconnections between those gates. The gates have associated functions, such as constants, constraints 134, targets 136, an initial state 132 of the design, primary inputs 144, primary outputs, combinational logic (e.g., AND gates), and sequential elements (hereafter referred to as registers 142). Registers 142 have two associated components; their next-state functions and their initial-value functions, which are represented as other gates in the graph. Semantically, for a given register 142, the value appearing at its initial-value gate at time '0' ("initialization" or "reset" time) will be applied as the value of the register 142 itself; the value appearing at its next-state function gate at time "i" will be applied to the register itself at time "i+1".

Binary decision diagrams 138 are a popular choice for efficiently applying Boolean reasoning to problems derived from circuit structures, which are frequently represented in netlist graphs. Binary decision diagrams 138 offer a compact and canonical representation of the Boolean function of a graph node, which expedites reasoning regarding a node's function.

Processor 104 executes instructions from programs, often stored in RAM 102, in the course of performing the present invention. In a preferred embodiment of the present invention, processor 104 executes verification toolset 124. Verification toolset 124 performs the creation of binary decision diagrams 138 through the operation of binary decision diagram builder 126 on the circuit specifications contained in design netlist 120, which contains instructions for modeling a simulated item of logical hardware.

In a preferred embodiment, the present invention is applied to a design netlist 120 representation where the only combinational gate type is a 2-input AND, and inverters are represented implicitly as edge attributes.

Targets 136 represent nodes whose Boolean expressions are of interest and need to be computed. The goal of the verification process is to find a way to drive a '1' on a target node, or to prove that no such assertion of the target is possible. In the former case, a "counterexample trace" showing the sequence of assignments to the inputs in every cycle leading up to the fail event getting triggered is generated and recorded to output table 122.

Verification toolset 124 includes a computer program product, stored in RAM 102 and executed on processor 104, which provides a series of tools for activities such as equivalence checking, property checking, logic synthesis and false-paths analysis. Generally speaking, verification toolset 124 contains rule-based instructions for predicting the behavior of logically modeled items of hardware.

Verification toolset 124 uses the series of rules contained in its own instructions, in conjunction with design netlist 120, to represent the underlying logical problem structurally (as a circuit graph), and uses binary decision diagram builder 126 to construct binary decision diagrams 138, thereby converting the structural representation into a functionally canonical form. In a preferred embodiment, verification toolset 124 includes a Cycle-Based Symbolic Simulator (CBSS), which performs a cycle-by-cycle simulation on design netlist 120 symbolically by applying unique random, or non-deterministic, variables to the netlist inputs in every cycle.

At each step the Boolean expressions, represented as BDDs 138, corresponding to each node in design netlist 120 are computed until the expressions for all "sink" nodes (i.e. nodes labeled as primary outputs, targets 136, constraints 134 and next-state functions of registers 142) are obtained. At each step of the simulation the Boolean expressions of the target nodes are tested for being non-zero. If so, a counterexample trace leading up to the failure (represented by the assertion of the target node to a '1') is returned to output table 122. Constraints 134 need to be factored in before this check for the targets being hit can be done. This factoring is typically accomplished by simply ANDing the Boolean expression for the target with the Boolean expression for each of the constraints.

A Cycle-Based Symbolic Simulator (CBSS), such as is contained in verification toolset 124, performs a cycle-by-cycle symbolic simulation on a netlist representation of the design in design netlist 124 symbolically by applying unique random, or non-deterministic, variables to inputs in design netlist 124 at every cycle. Verification toolset 124 essentially performs forward BDD-based bounded symbolic simulation, starting from initial state 132. Verification toolset 124 extends the cycle simulation methodology to symbolic values. Verification toolset 124 applies symbolic functions to the inputs in every cycle and propagates them to the targets 136. At each step the Boolean expressions, represented as binary decision diagrams 138, corresponding to each node in design netlist 120 are computed until the expressions for all "sink" nodes, i.e. nodes labeled as primary outputs, targets 136, constraints 134 and next-state functions of registers, are obtained.

At each step of the simulation the Boolean expressions of the target 136 nodes are tested for being non-zero. If so, a counterexample trace leading up to the failure (represented by the assertion of the target node to a '1') is returned and reported to output table 122. If unsolved targets 136 remain, then the registers are updated with the values, represented as binary decision diagrams 138, of the next-state functions, and the process continues. At every step of the verification process, there is a potential for a blow-up in memory when computing the binary decision diagrams 138 for any of the sink nodes.

The method of the present invention addresses the risk of memory blow-up when computing intermediate binary decision diagrams 138 in several steps through target enlargement by a target enlargement unit 146 to create enlarged targets 148.

The target enlargement method provided by the present invention through the use of target enlargement unit 146 is a technique to render enlarged targets 148, which may be hit at a shallower depth from the initial states 132 of design netlist 120, and with a higher probability, than the original targets 136. Target enlargement under the method of the present invention uses preimage computation to calculate the set of states which may hit targets 136 within k time-steps. Inductive simplification may be performed upon the i-th preimage by verification toolset 124 to eliminate states which hit t in fewer than i time-steps.

The result of this calculation by verification toolset 124 is the characteristic function of a state set (S) 150 which is a subset of all states that can hit a target (t) from among targets 136 in 0, . . . , k steps, and a superset of those that can hit a target (t) from among targets 136 in exactly k steps minus those that can hit a target (t) from among targets 136 in 0 . . . , k−1 steps. State set (S) 150 may be synthesized as the enlarged target t' among enlarged targets 148. If the enlarged target t' among enlarged targets 148 is unreachable, then the target (t) from among targets 136 must also be unreachable. If target t' among enlarged targets 148 is hit in trace $1^{st}$ trace (p') 152, a corresponding $2^{nd}$ trace (p) 154 hitting the target (t) from among targets 136 may be obtained by casting a k-step bounded search from the state among state set (S) 150 hitting target t' among enlarged targets 148 in $1^{st}$ trace (p') 152, which is satisfiable by construction, and concatenating the result to $1^{st}$ trace (p') 152 to form $2^{nd}$ trace (p) 154.

The method of the present invention for target enlargement is performed by target enlargement unit 146 in several steps, which are embodied in the following psuedocode:

---

1. Compute f(t) as the function of the target t, over registers and inputs in its combinational fanin cone.
2. Compute f(c__i) as the function of each constraint c__i, over registers and inputs in its combinational fanin cone.
3. B__0 = existentially__quantify__inputs( f(t) AND f(c__1) AND f(c__2) AND ... AND f(c__n))
4. for (i = 1; NOT done; i++)
   5. Use i-step bounded analysis to see if t may be hit at time i−1 while adhering to constraints. If it can, return the corresponding trace
   6. B__i = existentially__quantify__inputs(preimage(B__{i−1}) AND f(c__1) AND f(c__2) AND ... AND f(c__n))
   7. Simplify B__i by applying B__0 ..... B__{i−1} as don't cares
8. Synthesize B__i using a standard multiplexor-based synthesis as the enlarged target t'
9. Perform verification of t'
10. If t' is proven unreachable, report t as unreachable
11. If trace p' is obtained hitting t' at time j
12. Cast an i-step constraint-satisfying unfolding from the state in p' at time j to hit t. This problem is satisfiable by construction, and yields trace p''
13. Concatenate the resulting trace p'' onto p' to form trace p hitting t at time i+j
14. Return p

---

Verification toolset 124 uses steps 1 and 2 of the method described in the pseudocode above to compute the functions of the target (t) from among targets 136 to be enlarged, as well as the constraint 134 gates. Verification toolset 124 uses step 3 to compute the state set (S) 150 which presently hit the target (t) from among targets 136 while adhering to constraints 134. Since a state in state set (S) 150 is a valuation only to the registers 142, verification toolset 124 existentially quantifies the inputs from this function. Target enlargement unit 146 uses steps 4-7 to perform the core target enlargement steps. Target enlargement unit 146 may iterate step 4 until the target (t) from among targets 136 is solved (e.g., verification toolset 124 hits the target in step 5, or B_i for some i becomes a constant 0, meaning that the enlarged state set (S) 150 is empty).

Additionally, resource bounds, such as an upper-bound on i or a time or memory limit on the processes of steps 5-7, may also cause verification toolset 124 to truncate this loop.

In step 5, verification toolset 124 uses an i-step bounded analysis to ensure that the target (t) from among targets 136 cannot be hit at time 0 . . . i−1. This step is useful to help ensure that the target enlargement process of target enlargement unit 146 preserves property checking, because the enlarged target t' among enlarged targets 148 may eliminate the states that may hit the target within 0 . . . i−1 time-steps due to its preimages of step 6 and don't caring of step 7. In the presence of constraints 134, this analysis by verification toolset 124 is enhanced to help ensure that constraint 134 semantics are adhered to. In step 6, verification toolset 124 relies upon a preimage computation, which enumerates the set of states which may reach the argument set of states B_{i−1} in one time-step. This set again is conjuncted by verification toolset 124 with each of the constraints 134 (similarly to step 3) to help restrict the analysis by verification toolset 124 to only the set of states among state set (S) 150 which adhere to the constraints 134. In step 7, verification toolset 124 simplifies the current set of enlarged target 148 states B_i by don't caring that set with respect to the earlier enlarged target sets.

For simplifying B_i with respect to B_0 . . . B_{i−1}, verification toolset 124 may use BDD operations within BDD builder 126, such as bdd_restrict 156 or bdd_compact 158, which alters the set B_i by either adding or deleting states in B_0 . . . B_{i−1}." This step is property preserving, noting that any $1^{st}$ trace (p') 152 hitting the enlarged target t' (a synthesis of B_i) among enlarged targets 148 must pass through a state among state set (S) 150 in B_i but not in B_0 . . . B_{i−1}, because the bounded search of step 5 ensures that the target among enlarged targets 148 cannot be hit more shallowly than i time-steps.

In step 8, verification toolset 124 replaces the original target (t) from among targets 136 with the state set (S) 150 for enlarged target t' among enlarged targets 148. A multiplexor-based BDD synthesis algorithm within BDD-builder 126 is used for this purpose, as will be described below. In step 9, verification toolset 124 performs verification or falsification effort on the enlarged target t' among enlarged targets 148. If the enlarged target t' among enlarged targets 148 is proven unreachable, in step 10 verification toolset 124 will directly infer that the original target from among targets 136 is unreachable. Otherwise, if the enlarged target t' among enlarged targets 148 is hit at time j in $1^{st}$ trace (p') 152, verification toolset 124 will map $1^{st}$ trace (p') 152 to $2^{nd}$ trace (p) 154, hitting the original target t among targets 136 in step 12 by casting an i-step bounded search from the state of time j in $1^{st}$ trace (p') 152 (which hit the enlarged target t' among enlarged targets 148) to try to hit target t among targets 136. This search by verification toolset 124 is satisfiable by construction of target t' among enlarged targets 148, and yields $3^{rd}$ trace (p") 160. However, $3^{rd}$ trace (p") 160 may generally begin from a non-initial state, because this bounded search was cast from the state at time j of trace $1^{st}$ trace (p') 152. Therefore, in step 13, verification toolset 124 concatenates trace $3^{rd}$ trace (p") 160 onto $1^{st}$ trace (p') 152, yielding a $2^{nd}$ trace (p) which hits the target (t) among targets 136 at time i+j. This $2^{nd}$ trace (p) 154 may be returned in step 14 as a valid trace hitting target (t) among targets 136.

A multiplexor-based BDD synthesis algorithm, used by BDD builder 126 is described by the following pseudocode:

```
gate SYNTHESIZE(BDD node) {
    if(node == BDD_ZERO) {return GATE_ZERO;}
    if(node == BDD_ONE) {return GATE_ONE;}
    invert = BDD_IS_INVERTED(node);
```

-continued

```
    node = BDD_CLEAR_INVERTED(node);
    gate = Synthesized(node);
    if(!gate) {
        gate = IF_THEN_ELSE(Get_Input(BDD_VARID(node)), //
        "if" clause
        SYNTHESIZE(BDD_THEN(node)), // "then" clause
        SYNTHESIZE(BDD_ELSE(node))); // "else" clause
        Synthesized(node) = gate;
    }
    if(invert) {return NOT gate;}
    return gate;
}
```

IF_THEN_ELSE creates a multiplexor, whose selector is the input gate correlating to BDD_VARID(node), and which drives the gate corresponding to the BDD_THEN branch if that selector evaluates to a 1, else drives the gate corresponding to the BDD_ELSE branch.

Figure 2A:
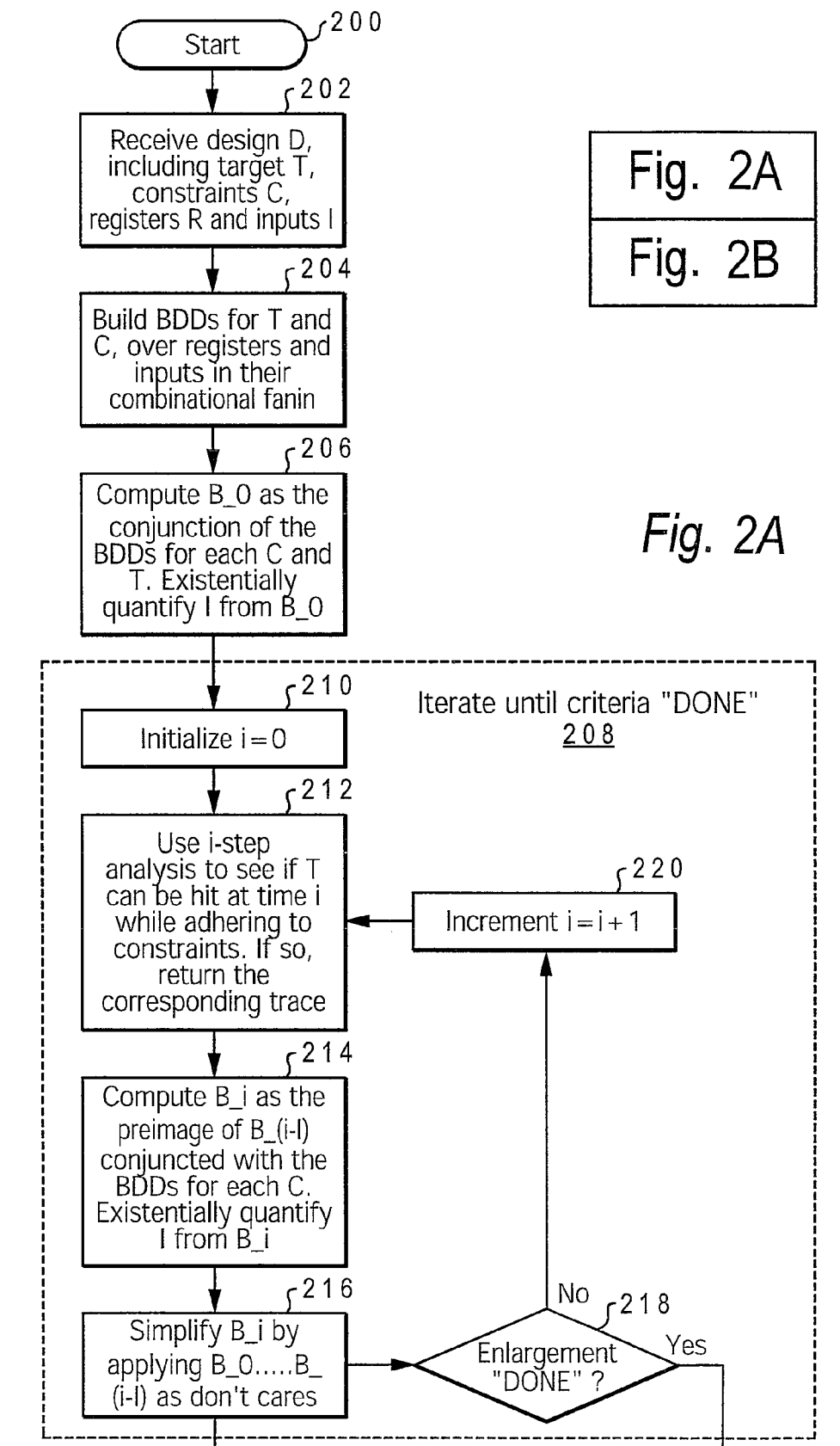
FIG. 2A-2B together form a high-level logical flow chart of a process for target enlargement in the presence of constraints in accordance with a preferred embodiment of the present invention.
Figure 2B:
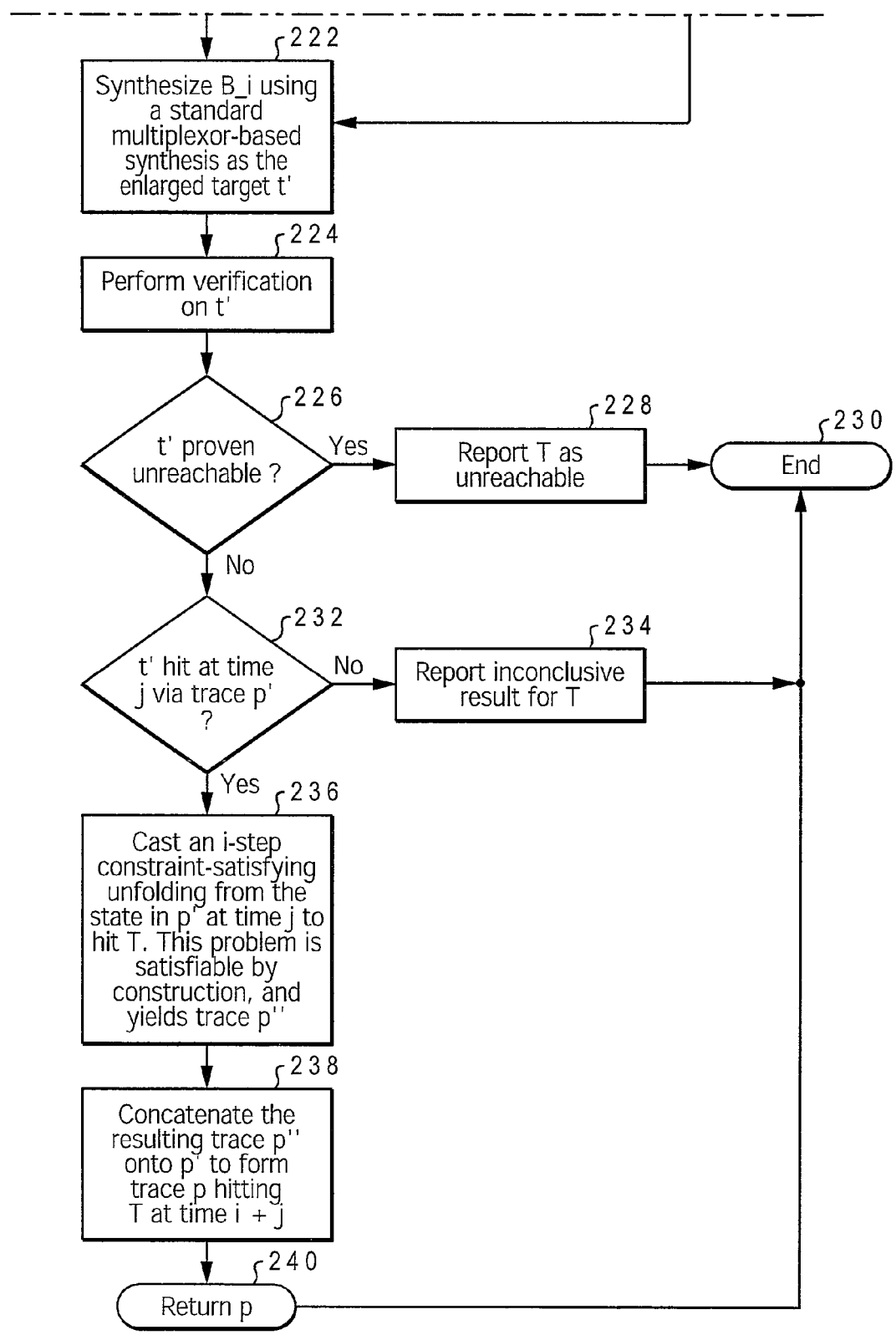

Turning now to FIG. 2, a high-level logical flowchart of a process for target enlargement in the presence of constraints in accordance with a preferred embodiment of the present invention is depicted. The process starts at step 200. The process then proceeds to step 202, which depicts logical simulator 124 receiving design netlist 120 including targets 136, constraints 134, registers 142, and inputs. The process then moves to step 204. At step 204, verification toolset 124 uses BDD builder 126 to build BDDs 138 for targets 136 and constraints 134 over registers 142 and inputs in their combinational fan-in. The process next proceeds to step 206, which depicts verification toolset 124 computing B_0 as the conjunction of the binary decision diagrams for each constraint 134 and enlarged target 148 and existentially quantifying inputs from B_0.

The process next moves to macro-step 208, which consists of an iterative loop of steps that is iterated of steps 210-220 by target enlargement unit 146 of verification toolset 124 until criteria indicate that the iterative process of macro-step 208 is complete. Macro-step 208 begins at step 210, which depicts initializing an iterative loop at i=0. The process then moves to step 212, which illustrates target enlargement unit 146 using an i-step bounded analysis to determine if targets 136 can be hit at time i−1 while adhering to constraints 134, and if so, returning the corresponding first trace (P') 152. The process then moves to step 214. At step 214, target enlargement unit 146 computes B_i as the preimage of B_{i−1} conjuncted with the binary decision diagrams 138 for each constraint 134 and existentially quantifies inputs from B_i. The process then moves to step 216, which depicts target enlargement unit 146 simplifying B_i by applying B_0, . . . , B_{i−1} as 'don't cares'.

The process then moves to step 218. At step 218, target enlargement unit 146 determines whether the enlargement is complete. If the enlargement is not complete then the process moves to step 220 which illustrates target enlargement unit incrementing i=i+1. The process then returns to step 212.

Returning to step 218, if target enlargement unit 146 determines that target enlargement is complete, then the process next moves to step 222. At step 222, BDD builder 126 synthesizes B_i using a (multiplexor-based) synthesis as the enlarged target 148. The process then proceeds to step 224. At step 224, logical simulator 124 performs verification on the enlarged targets 148. The process then moves to step 226, which depicts verification toolset 124 determining whether the enlarged targets 148 have been proven unreachable. If the enlarged targets 148 have been proven unreachable, then the process next proceeds to step 228. At step 228 verification toolset 124 reports to output table 122 that the target 136 is unreachable. The process then ends at step 230.

Returning to step 226, if verification toolset 124 does not determine that enlarged targets 148 are proven unreachable then the process next moves to step 232, which depicts verification toolset 124 determining whether the enlarged targets are hit at time j via first trace (P') 152. If verification toolset 124 determines that enlarged target 148 is not hit at time j via first trace (P') 152, then the process next moves to step 234. At step 234, verification toolset 124 reports an inconclusive result for target 136 to output table 122. The process then ends at step 230.

Returning to step 232 if verification toolset 124 determines that enlarged targets 148 are hit at time j via first trace (P') 152, then the process moves to step 236. At step 236, verification toolset 124 casts an i-step constraint-satisfying unfolding from the state in first trace (P') 152 at time j to hit targets 136. This unfolding is satisfiable by construction of the enlarged target, and yields third trace (P''') 160. Verification toolset 124 also casts an i-step constraint-satisfying unfolding from the state in first trace (P') 152 at time j to hit targets 136. The process then moves to step 238, which depicts verification toolset 124 concatenating the resulting third trace (P''') 160 onto first trace (P') 152 to form second trace (P) 154 hitting targets 136 t at time I+j. The process then moves to step 240. At step 240 verification toolset 124 returns second trace P 154 to output table 122. The process then ends at step 230.

Accordingly, the present invention may suitably be embodied as a computer program product for use with a computer system. Such an implementation may comprise a series of computer readable instructions either fixed on a tangible medium, such as a computer readable medium, for example, diskette, CD-ROM, ROM, or hard disk, or transmittable to a computer system, via a modem or other interface device, over either a tangible medium, including but not limited to optical or analog communications lines, or intangibly using wireless techniques, including but not limited to microwave, infrared or other transmission techniques. The series of computer readable instructions embodies all or part of the functionality previously described herein.

Those skilled in the art will appreciate that such computer readable instructions can be written in a number of programming languages for use with many computer architectures or operating systems. Further, such instructions may be stored using any memory technology, present or future, including but not limited to, semiconductor, magnetic, or optical, or transmitted using any communications technology, present or future, including but not limited to optical, infrared, or microwave. It is contemplated that such a computer program product may be distributed as a removable medium with accompanying printed or electronic documentation, for example, shrink-wrapped software, pre-loaded with a computer system, for example, on a system RON or fixed disk, or distributed from a server or electronic bulletin board over a network, for example, the internet or World Wide Web.

Software Deployment

Figure 3A:
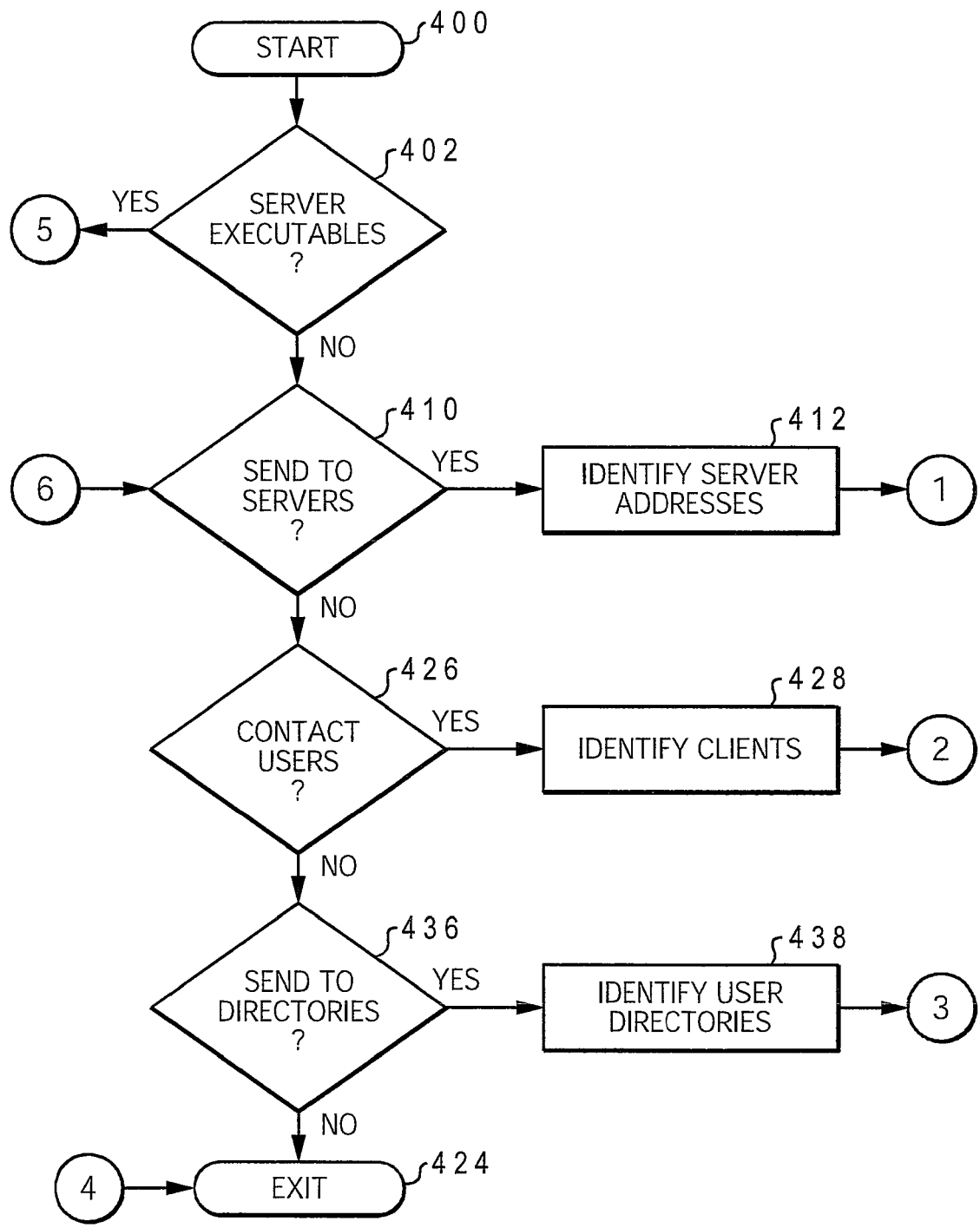
FIGS. 3A-3B show a flow-chart of steps taken to deploy software capable of executing the steps shown in FIG. 2A-2B.
Figure 3B:
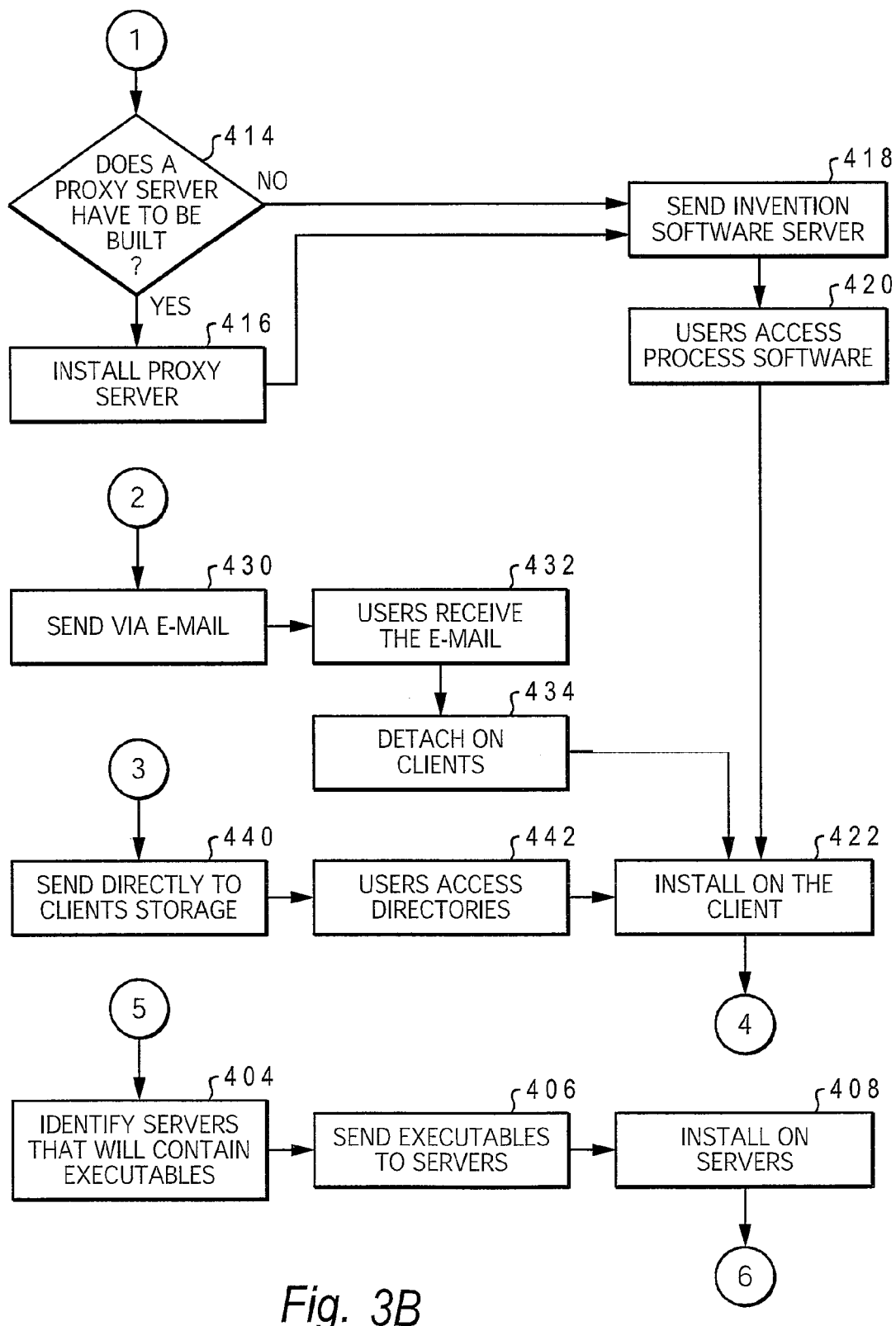
Figure 4A:
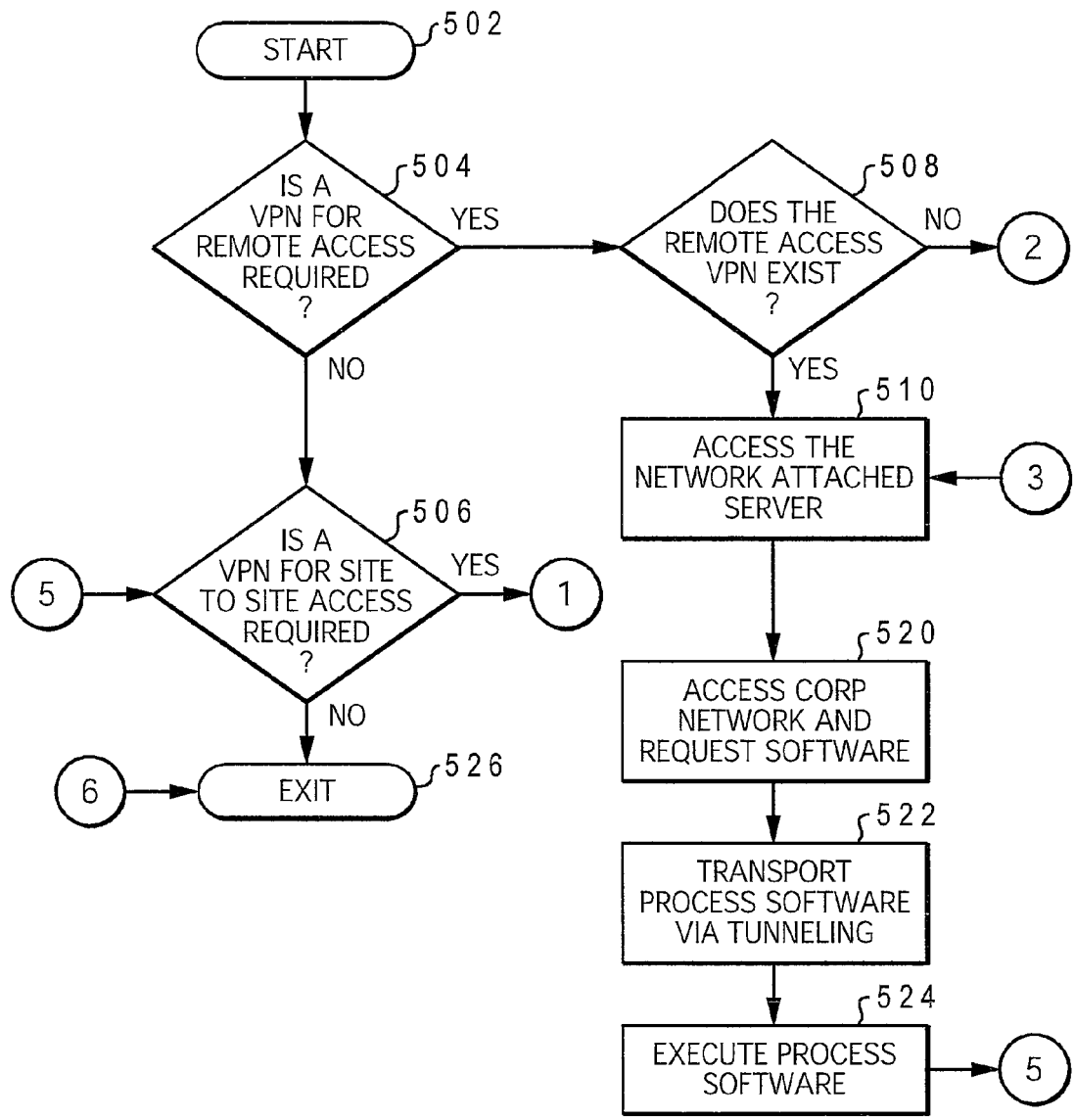
FIGS. 4A-4C show a flow-chart of steps taken to deploy in a Virtual Private Network (VPN) software that is capable of executing the steps shown in FIGS. 2A-2B.
Figure 4B:
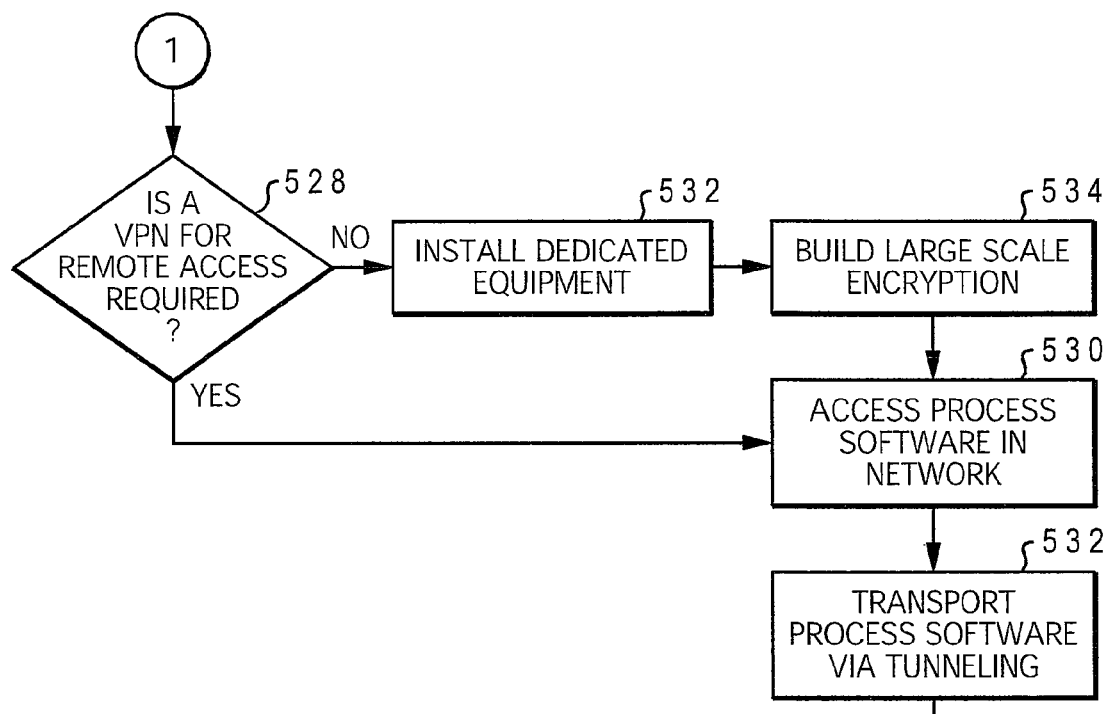
Figure 4C:
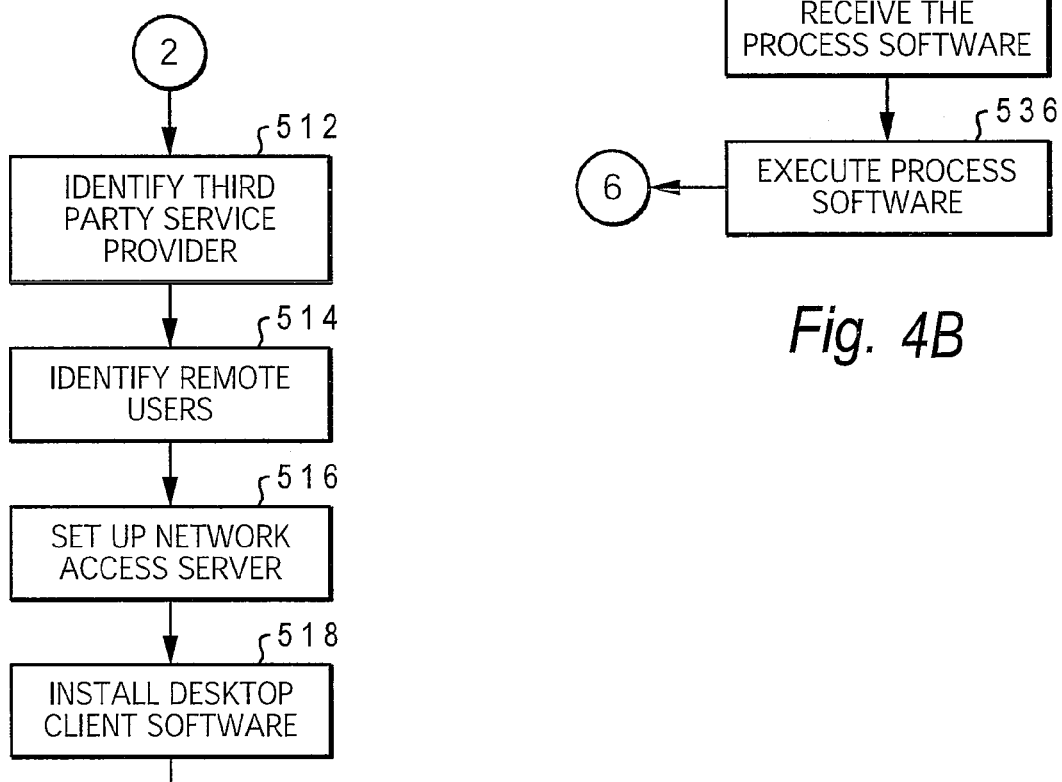

Thus, the method described herein, and in particular as shown in FIGS. 2 and 3, can be deployed as a process software. Referring now to FIG. 4, step 400 begins the deployment of the process software. The first thing is to determine if there are any programs that will reside on a server or servers when the process software is executed (query block 402). If this is the case, then the servers that will contain the executables are identified (block 404). The process software for the server or servers is transferred directly to the servers' storage via File Transfer Protocol (FTP) or some other protocol or by copying though the use of a shared file system (block 406). The process software is then installed on the servers (block 408).

Next, a determination is made on whether the process software is be deployed by having users access the process software on a server or servers (query block 410). If the users are to access the process software on servers, then the server addresses that will store the process software are identified (block 412).

A determination is made if a proxy server is to be built (query block 414) to store the process software. A proxy server is a server that sits between a client application, such as a Web browser, and a real server. It intercepts all requests to the real server to see if it can fulfill the requests itself. If not, it forwards the request to the real server. The two primary benefits of a proxy server are to improve performance and to filter requests. If a proxy server is required, then the proxy server is installed (block 416). The process software is sent to the servers either via a protocol such as FTP or it is copied directly from the source files to the server files via file sharing (block 418). Another embodiment would be to send a transaction to the servers that contained the process software and have the server process the transaction, then receive and copy the process software to the server's file system. Once the process software is stored at the servers, the users via their client computers, then access the process software on the servers and copy to their client computers file systems (block 420). Another embodiment is to have the servers automatically copy the process software to each client and then run the installation program for the process software at each client computer. The user executes the program that installs the process software on his client computer (block 422) then exits the process (terminator block 424).

In query step 426, a determination is made whether the process software is to be deployed by sending the process software to users via e-mail. The set of users where the process software will be deployed are identified together with the addresses of the user client computers (block 428). The process software is sent via e-mail to each of the users' client computers (block 430). The users then receive the e-mail (block 432) and then detach the process software from the e-mail to a directory on their client computers (block 434). The user executes the program that installs the process software on his client computer (block 422) then exits the process (terminator block 424).

Lastly a determination is made on whether to the process software will be sent directly to user directories on their client computers (query block 436). If so, the user directories are identified (block 438). The process software is transferred directly to the user's client computer directory (block 440). This can be done in several ways such as but not limited to sharing of the file system directories and then copying from the sender's file system to the recipient user's file system or alternatively using a transfer protocol such as File Transfer Protocol (FTP). The users access the directories on their client file systems in preparation for installing the process software (block 442). The user executes the program that installs the process software on his client computer (block 422) and then exits the process (terminator block 424).

VPN Deployment

The present software can be deployed to third parties as part of a service wherein a third party VPN service is offered as a secure deployment vehicle or wherein a VPN is build on-demand as required for a specific deployment.

A virtual private network (VPN) is any combination of technologies that can be used to secure a connection through an otherwise unsecured or untrusted network. VPNs improve security and reduce operational costs. The VPN makes use of a public network, usually the Internet, to connect remote sites or users together. Instead of using a dedicated, real-world connection such as leased line, the VPN uses "virtual" connections routed through the Internet from the company's private network to the remote site or employee. Access to the software via a VPN can be provided as a service by specifically constructing the VPN for purposes of delivery or execution of the process software (i.e. the software resides elsewhere) wherein the lifetime of the VPN is limited to a given period of time or a given number of deployments based on an amount paid.

The process software may be deployed, accessed and executed through either a remote-access or a site-to-site VPN. When using the remote-access VPNs the process software is deployed, accessed and executed via the secure, encrypted connections between a company's private network and remote users through a third-party service provider. The enterprise service provider (ESP) sets a network access server (NAS) and provides the remote users with desktop client software for their computers. The telecommuters can then dial a toll-bee number or attach directly via a cable or DSL modem to reach the NAS and use their VPN client software to access the corporate network and to access, download and execute the process software.

When using the site-to-site VPN, the process software is deployed, accessed and executed through the use of dedicated equipment and large-scale encryption that are used to connect a companies multiple fixed sites over a public network such as the Internet.

The process software is transported over the VPN via tunneling which is the process the of placing an entire packet within another packet and sending it over a network. The protocol of the outer packet is understood by the network and both points, called runnel interfaces, where the packet enters and exits the network.

Figure 5A:
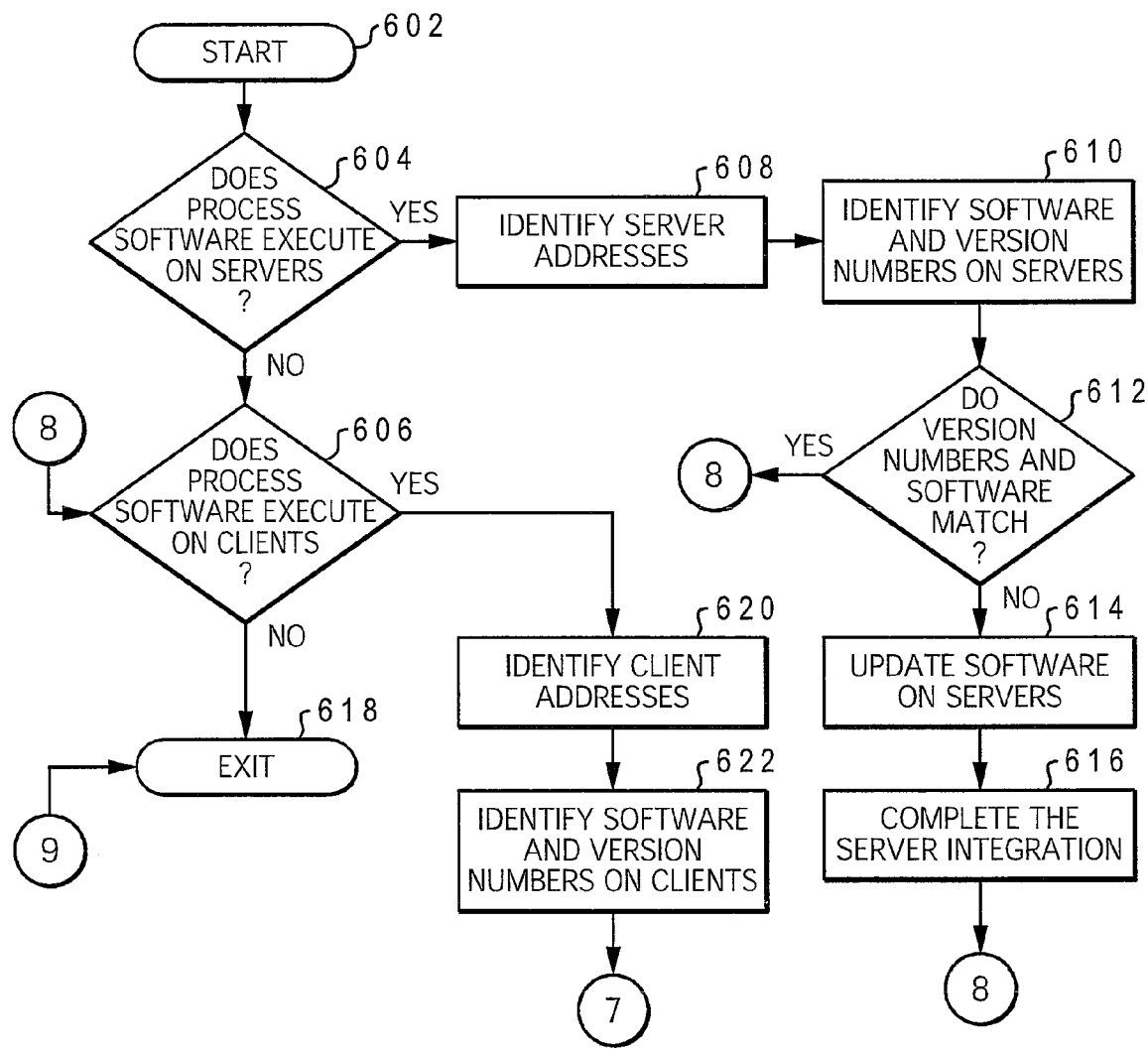
FIGS. 5A-5B together form a flow-chart showing steps taken to integrate into an computer system software that is capable of executing the steps shown in FIGS. 2A-2B and 3A-3B.
Figure 5B:
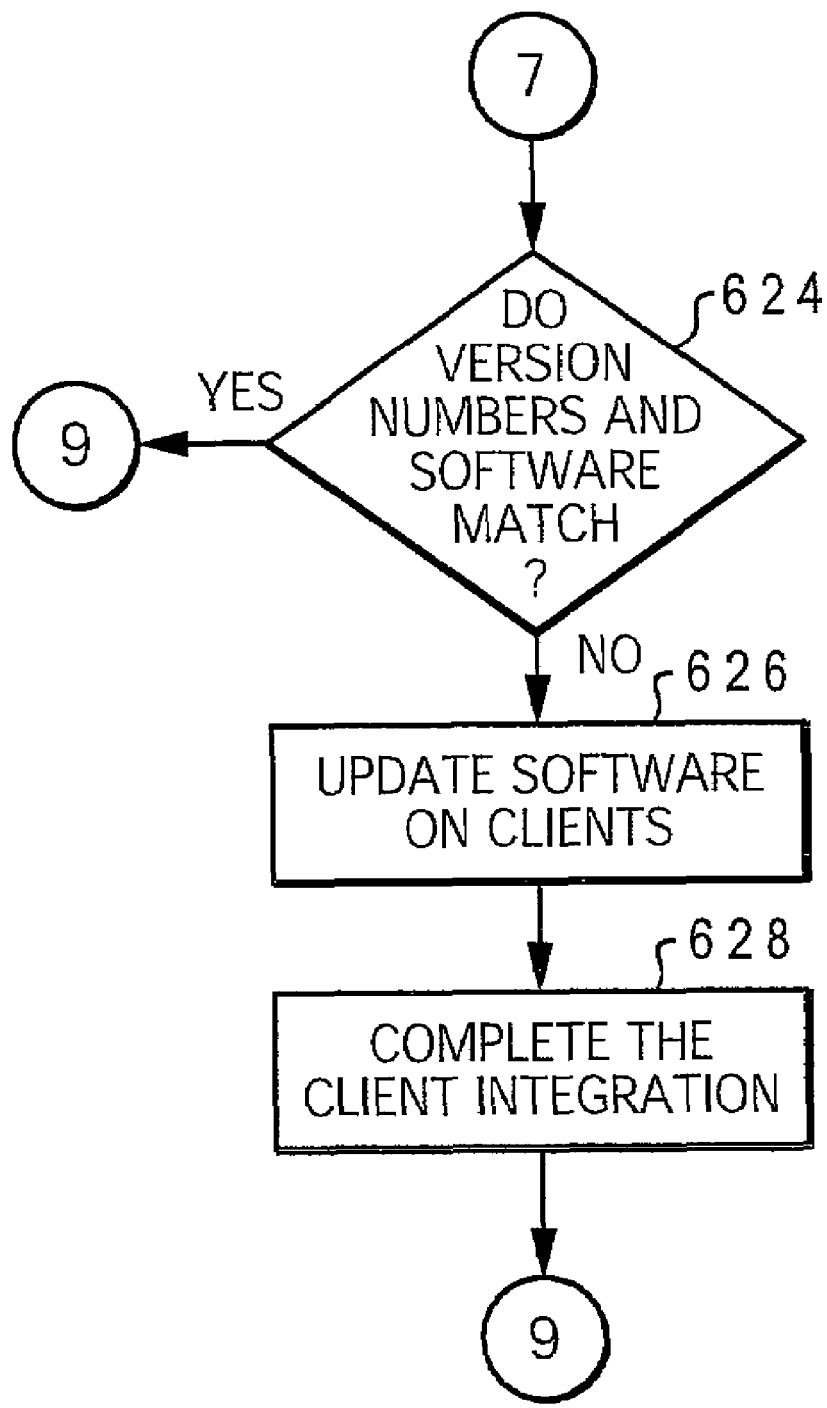

The process for such VPN deployment is described in FIG. 5. Initiator block 502 begins the Virtual Private Network (VPN) process. A determination is made to see if a VPN for remote access is required (query block 504). If it is not required, then proceed to (query block 506). If it is required, then determine if the remote access VPN exists (query block 508).

If a VPN does exist, then proceed to block 510. Otherwise identify a third party provider that will provide the secure, encrypted connections between the company's private network and the company's remote users (block 512). The company's remote users are identified (block 514). The third party provider then sets up a network access server (NAS) (block 516) that allows the remote users to dial a toll free number or attach directly via a broadband modem to access, download and install the desktop client software for the remote-access VPN (block 518).

After the remote access VPN has been built or if it been previously installed, the remote users can access the process software by dialing into the NAS or attaching directly via a cable or DSL modem into the NAS (block 510). This allows entry into the corporate network where the process software is accessed (block 520). The process software is transported to the remote user's desktop over the network via tunneling. That is the process software is divided into packets and each packet including the data and protocol is placed within another packet (block 522). When the process software arrives at the remote user's desk-top, it is removed from the packets, reconstituted and then is executed on the remote users desk-top (block 524).

A determination is then made to see if a VPN for site to site access is required (query block 506). If it is not required, then proceed to exit the process (terminator block 526). Otherwise, determine if the site to site VPN exists (query block 528). If it does exist, then proceed to block 530. Otherwise, install the dedicated equipment required to establish a site to site VPN (block 532). Then build the large scale encryption into the VPN (block 534).

After the site to site VPN has been built or if it had been previously established, the users access the process software via the VPN (block 530). The process software is transported to the site users over the network via tunneling (block 532). That is the process software is divided into packets and each packet including the data and protocol is placed within another packet (block 534). When the process software arrives at the remote user's desktop, it is removed from the packets, reconstituted and is executed on the site users desktop (block 536). The process then ends at terminator block 526.

Software Integration

The process software which consists code for implementing the process described herein may be integrated into a client, server and network environment by providing for the process software to coexist with applications, operating systems and network operating systems software and then installing the process software on the clients and servers in the environment where the process software will function.

The first step is to identify any software on the clients and servers including the network operating system where the process software will be deployed that are required by the process software or that work in conjunction with the process software. This includes the network operating system that is software that enhances a basic operating system by adding networking features.

Next, the software applications and version numbers will be identified and compared to the list of software applications and version numbers that have been tested to work with the process software. Those software applications that are missing or that do not match the correct version will be upgraded with the correct version numbers. Program instructions that pass parameters from the process software to the software applications will be checked to ensure the parameter lists matches the parameter lists required by the process software. Conversely parameters passed by the software applications to the process software will be checked to ensure the parameters match the parameters required by the process software. The client and server operating systems including the network operating systems will be identified and compared to the list of operating systems, version numbers and network software that have been tested to work with the process software. Those operating systems, version numbers and network software that do not match the list of tested operating systems and version numbers will be upgraded on the clients and servers to the required level.

After ensuring that the software, where the process software is to be deployed, is at the correct version level that has been tested to work with the process software, the integration is completed by installing the process software on the clients and servers.

Figure 6A:
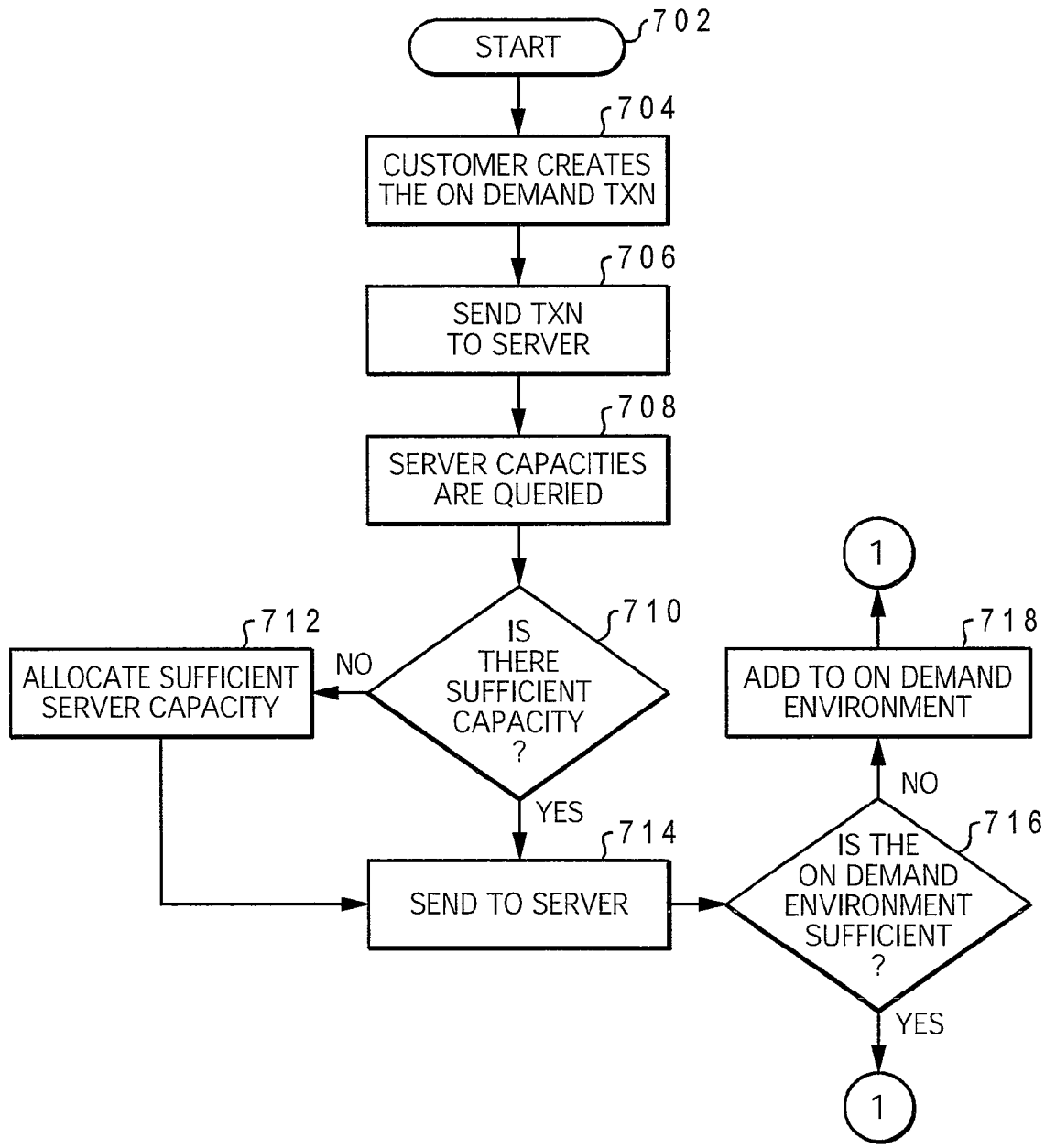
FIGS. 6A-6B show a flow-chart showing steps taken to execute the steps shown in FIGS. 2A-2B using an on-demand service provider.
Figure 6B:
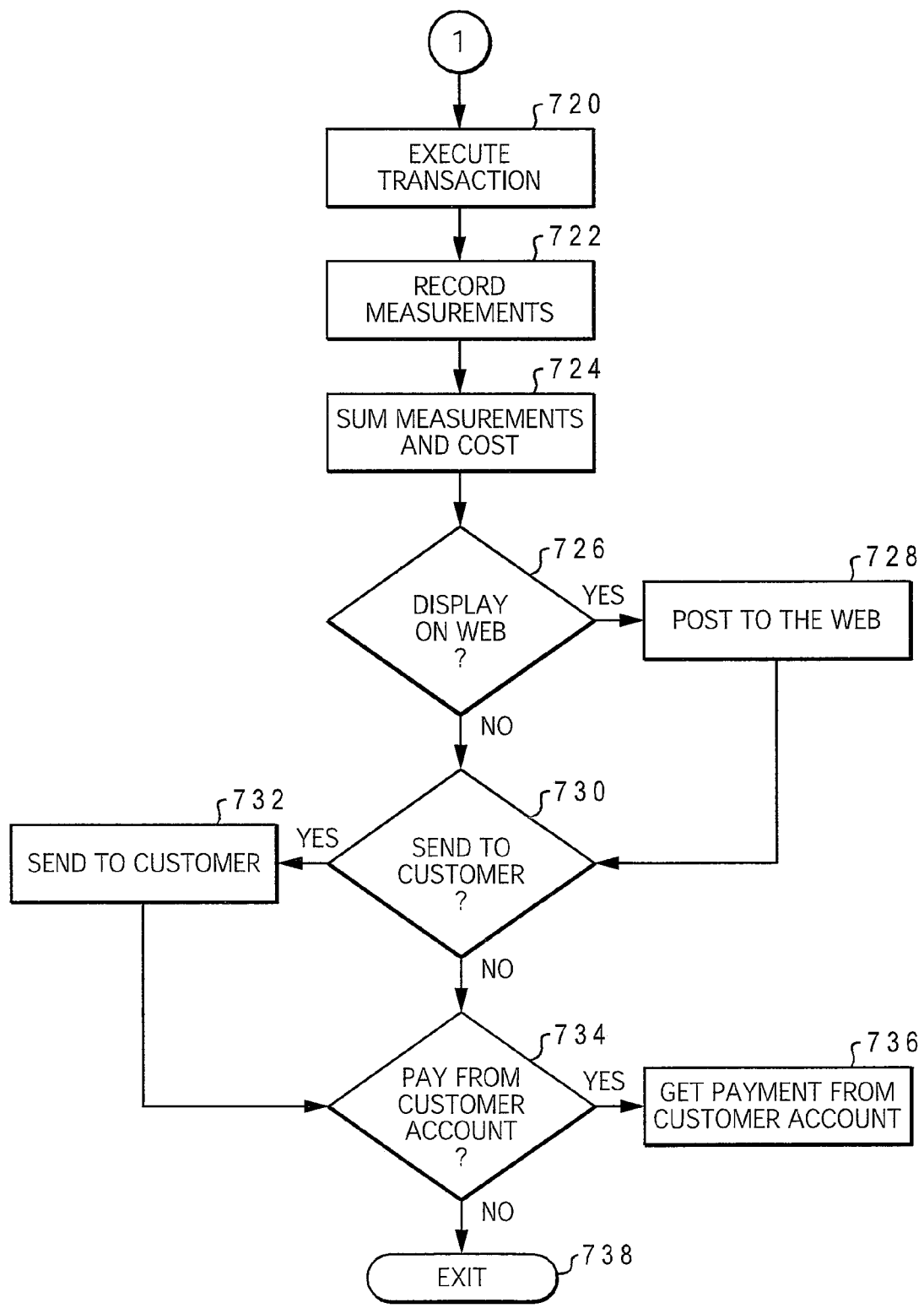

For a high-level description of this process, reference is now made to FIG. 6. Initiator block 602 begins the integration of the process software. The first tiling is to determine if there are any process software programs that will execute on a server or servers (block 604). If this is not the case, then integration proceeds to query block 606. If this is the case, then the server addresses are identified (block 608). The servers are checked to see if they contain software that includes the operating system (OS), applications, and network operating systems (NOS), together with their version numbers, which have been tested with the process software (block 610). The servers are also checked to determine if there is any missing software that is required by the process software in block 610.

A determination is made if the version numbers match the version numbers of OS, applications and NOS that have been tested with the process software (block 612). If all of the versions match and there is no missing required software the integration continues in query block 606.

If one or more of the version numbers do not match, then the unmatched versions are updated on the server or servers with the correct versions (block 614). Additionally, if there is missing required software, then it is updated on the server or servers in the step shown in block 614. The server integration is completed by installing the process software (block 616).

The step shown in query block 606, which follows either the steps shown in block 604, 612 or 616 determines if there are any programs of the process software that will execute on the clients. If no process software programs execute on the clients the integration proceeds to terminator block 618 and exits. If this not the case, then the client addresses are identified as shown in block 620.

The clients are checked to see if they contain software that includes the operating system (OS), applications, and network operating systems (NOS), together with their version numbers, which have been tested with the process software (block 622). The clients are also checked to determine if there is any missing software that is required by the process software in the step described by block 622.

A determination is made is the version numbers match the version numbers of OS, applications and NOS that have been tested with the process software (query block 624). If all of the versions match and there is no missing required software, then the integration proceeds to terminator block 618 and exits.

If one or more of the version numbers do not match, then the unmatched versions are updated on the clients with the correct versions (block 626). In addition, if there is missing required software then it is updated on the clients (also block 626). The client integration is completed by installing the process software on the clients (block 628). The integration proceeds to terminator block 618 and exits.

On Demand

The process software is shared, simultaneously serving multiple customers in a flexible, automated fashion. It is standardized, requiring little customization and it is scalable, providing capacity on demand in a pay-as-you-go model.

The process software can be stored on a shared file system accessible from one or more servers. The process software is executed via transactions that contain data and server processing requests that use CPU units on the accessed server. CPU units are units of time such as minutes, seconds, hours on the central processor of the server. Additionally the assessed server may make requests of other servers that require CPU units. CPU units are an example that represents but one measurement of use. Other measurements of use include but are not limited to network bandwidth, memory usage, storage usage, packet transfers, complete transactions etc.

When multiple customers use the same process software application, their transactions are differentiated by the parameters included in the transactions that identify the unique customer and the type of service for that customer. All of the CPU units and other measurements of use that are used for the services for each customer are recorded. When the number of transactions to any one server reaches a number that begins to affect the performance of that server, other servers are accessed to increase the capacity and to share the workload. Likewise when other measurements of use such as network bandwidth, memory usage, storage usage, etc. approach a capacity so as to affect performance, additional network bandwidth, memory usage, storage etc. are added to share the workload.

The measurements of use used for each service and customer are sent to a collecting server that sums the measurements of use for each customer for each service that was processed anywhere in the network of servers that provide the shared execution of the process software. The summed measurements of use units are periodically multiplied by unit costs and the resulting total process software application service costs are alternatively sent to the customer and or indicated on a web site accessed by the customer which then remits payment to the service provider.

In another embodiment, the service provider requests payment directly from a customer account at a banking or financial institution.

In another embodiment, if the service provider is also a customer of the customer that uses the process software application, the payment owed to the service provider is reconciled to the payment owed by the service provider to minimize the transfer of payments.

With reference now to FIG. 7, initiator block 702 begins the On Demand process. A transaction is created than contains the unique customer identification, the requested service type and any service parameters that further, specify the type of service (block 704). The transaction is then sent to the main server (block 706). In an On Demand environment the main server can initially be the only server, then as capacity is consumed other servers are added to the On Demand environment.

The server central processing unit-(CPU) capacities in the On Demand environment are queried (block 708). The CPU requirement of the transaction is estimated, then the servers available CPU capacity in the On Demand environment are compared to the transaction CPU requirement to see if there is sufficient CPU available capacity in any server to process the transaction (query block 710). If there is not sufficient server CPU available capacity, then additional server CPU capacity is allocated to process the transaction (block 712). If there was already sufficient Available CPU capacity then the transaction is sent to a selected server (block 714).

Before executing the transaction, a check is made of the remaining On Demand environment to determine if the environment has sufficient available capacity for processing the transaction. This environment capacity consists of such things as but not limited to network bandwidth, processor memory, storage etc. (block 716). If there is not sufficient available capacity, then capacity will be added to the On Demand environment (block 718). Next the required software to process the transaction is accessed, loaded into memory, then the transaction is executed (block 720).

The usage measurements are recorded (block 722). The usage measurements consist of the portions of those functions in the On Demand environment that are used to process the transaction. The usage of such functions as, but not limited to, network bandwidth, processor memory, storage and CPU cycles are what is recorded. The usage measurements are summed, multiplied by unit costs and then recorded as a charge to the requesting customer (block 724).

If the customer has requested that the On Demand costs be posted to a web site (query block 726), then they are posted (block 728). If the customer has requested that the On Demand costs be sent via e-mail to a customer address (query block 730), then these costs are sent to the customer (block 732). If the customer has requested that the On Demand costs be paid directly from a customer account (query block 734), then payment is received directly from the customer account (block 736). The On Demand process is then exited at terminator block 738.

While the invention has been particularly shown as described with reference to a preferred embodiment, it will be understood by those skilled in the art that various changes in form and detail may be made therein without departing from the spirit and scope of the invention. It is also important to note that although the present invention has been described in the context of a fully functional computer system, those skilled in the art will appreciate that the mechanisms of the present invention are capable of being distributed as a program product in a variety of forms, and that the present invention applies equally regardless of the particular type of signal bearing media utilized to actually carry out the distribution. Examples of signal bearing media include, without limitation, recordable type media such as floppy disks or CD ROMs and transmission type media such as analog or digital communication links.

What is claimed is:

1. A system for performing verification, said system comprising:
    means for receiving a design including one or more targets, one or more constraints, one or more registers and one or more inputs;
    means for computing a first function of one of said one or more targets over said one or more registers and said one or more inputs;
    means for computing a second function of one or more of said one or more constraints over said one or more registers and said one or more inputs;
    means for existentially quantifying said inputs of said first function and said second function;
    means for performing a bounded analysis to determine if said one of said one or more targets may be hit while adhering to said constraints;
    means for existentially quantifying a preimage of said inputs of said first function and said inputs of said second function to create a synthesizable preimage;
    means for simplifying said synthesizable preimage;
    means for synthesizing said synthesizable preimage to create an enlarged target; and
    means for performing verification of said enlarged target.

2. The system of claim 1, wherein said means for synthesizing said preimage to create said enlarged target further comprises means for synthesizing said preimage using multiplexor based synthesis to create an enlarged target.

3. The system of claim 1, further comprising:
    means for, in response to proving said enlarged target is unreachable, reporting said enlarged target as unreachable.

4. The system of claim 1, further comprising:
    means, responsive to said verification of said enlarged target returning a first trace in which said enlarged target is hit, for casting an i-step constraint-satisfying unfolding from a state of said first trace at a first time to hit said one of said one or more targets and obtain a second trace;
    means for concatenating said first trace onto said second trace to generate a third trace hitting said one of said one or more targets at a second time; and
    means for returning said third trace.

5. The system of claim 1, wherein:
    said means for performing said bounded analysis to determine if said one of said one or more targets may be hit while adhering to said constraints further comprises means for performing an i-step bounded analysis to determine if said one of said one or more targets may be hit within a selectably fixed time frame while adhering to said constraints.

6. The system of claim 1, further comprising:
    means for, in response to determining that said one of said one or more targets may be hit within a selectably fixed time frame while adhering to said constraints, returning a first trace corresponding to said hit.

7. The system of claim 1, wherein:
    said means for computing a first function of one of said one or more targets over said one or more registers and said one or more inputs further comprises means for computing a first function of one of said one or more targets over said one or more registers and said one or more inputs wherein said inputs are in a combinational fanin cone of said target; and wherein said means for computing a second function of one or more of said one or more constraints over said one or more registers and said one or more inputs further comprises means for computing a second function of one or more of said one or more constraints over said one or more registers and said one or more inputs wherein said inputs are in a combinational fanin cone of said constraint.

8. A machine-readable medium having a plurality of instructions processable by a machine embodied therein, wherein said plurality of instructions, when processed by said machine, causes said machine to perform a method comprising:
    receiving a design including one or more targets, one or more constraints, one or more registers and one or more inputs;
    computing a first function of one of said one or more targets over said one or more registers and said one or more inputs;
    computing a second function of one or more of said one or more constraints over said one or more registers and said one or more inputs;
    existentially quantifying said inputs of said first function and said second function;
    performing a bounded analysis to determine if said one of said one or more targets may be hit while adhering to said constraints;
    existentially quantifying a preimage of said inputs of said first function and said inputs of said second function to create a synthesizable preimage;
    simplifying said synthesizable preimage;
    synthesizing said synthesizable preimage to create an enlarged target; and
    performing verification of said enlarged target.

9. The machine-readable medium of claim 8, wherein said step of synthesizing said preimage to create said enlarged target further comprises synthesizing said preimage using multiplexor based synthesis to create an enlarged target.

10. The machine-readable medium of claim 8, wherein said method further comprises:
    in response to proving said enlarged target is unreachable, reporting said enlarged target as unreachable.

11. The machine-readable medium of claim 8, wherein said method further comprises:
    in response to said verification of said enlarged target returning a first trace, casting an i-step constraint-satisfying unfolding from a state of said first trace at a first time to hit said one of said one or more targets and obtain a second trace;

concatenating said second trace onto said first trace to generate a third trace hitting said one of said one or more targets at a second time; and returning said third trace.

12. The machine-readable medium of claim 8, wherein the processable instructions are deployed to a server from a remote location.

13. The machine-readable medium of claim 8, wherein the processable instructions are provided by a service provider to a customer on an on-demand basis.

* * * * *